(12) United States Patent
Asanza Maldonado

(10) Patent No.: US 11,264,795 B2
(45) Date of Patent: Mar. 1, 2022

(54) ELECTRONIC CIRCUIT BREAKER AND METHOD FOR OPERATING SAME

(71) Applicant: ELLENBERGER & POENSGEN GMBH, Altdorf (DE)

(72) Inventor: Diego Fernando Asanza Maldonado, Nuremberg (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 1 day.

(21) Appl. No.: 16/815,054

(22) Filed: Mar. 11, 2020

(65) Prior Publication Data

US 2020/0212671 A1 Jul. 2, 2020

Related U.S. Application Data

(63) Continuation of application No. PCT/EP2018/059590, filed on Apr. 13, 2018.

(30) Foreign Application Priority Data

Sep. 27, 2017 (DE) .............................. 102017217232

(51) Int. Cl.
*H02H 9/02* (2006.01)
*H02H 9/00* (2006.01)
*H03K 17/081* (2006.01)
*H03K 17/082* (2006.01)

(52) U.S. Cl.
CPC ............ *H02H 9/023* (2013.01); *H02H 9/001* (2013.01); *H02H 9/02* (2013.01); *H02H 9/025* (2013.01); *H03K 17/0822* (2013.01); *H03K 17/08104* (2013.01); *H03K 17/081* (2013.01); *H03K 17/082* (2013.01)

(58) Field of Classification Search
CPC ............ H02H 9/02; H02H 9/00; H02H 9/023; H02H 9/025; H02H 9/001; H02H 3/00; H02H 3/08; H03K 17/081; H03K 17/082; H03K 17/0822; H03K 17/08104
USPC ..................................... 361/86–87, 93.7–93.9
See application file for complete search history.

(56) References Cited

U.S. PATENT DOCUMENTS

| | | | |
|---|---|---|---|
| 5,943,203 A | 8/1999 | Wang | |
| 6,356,423 B1 | 3/2002 | Hastings et al. | |
| 9,276,530 B1* | 3/2016 | Liu | H03F 3/2171 |
| 2006/0221528 A1* | 10/2006 | Li | H05B 6/06 |
| | | | 361/100 |
| 2012/0075761 A1* | 3/2012 | Miura | H03K 17/0828 |
| | | | 361/93.1 |
| 2014/0021893 A1* | 1/2014 | Komatsu | H02H 3/08 |
| | | | 318/400.22 |

(Continued)

FOREIGN PATENT DOCUMENTS

DE 60130164 T2 5/2008

*Primary Examiner* — Danny Nguyen
(74) *Attorney, Agent, or Firm* — Laurence A. Greenberg; Werner H. Stemer; Ralph E. Locher

(57) ABSTRACT

An electronic circuit breaker contains a first semiconductor switch which is switched into a current path between a voltage input and a load output and contains a controller which is connected to the control input of the first semiconductor switch. The first semiconductor switch is actuated depending on an actual value of the load current, the actual value is supplied to the controller, and the controller is configured to limit the current of the first semiconductor switch and disconnect same.

11 Claims, 8 Drawing Sheets

(56) References Cited

U.S. PATENT DOCUMENTS

2015/0026486 A1  1/2015  Liu

* cited by examiner

ELECTRONIC CIRCUIT BREAKER AND METHOD FOR OPERATING SAME

CROSS-REFERENCE TO RELATED APPLICATION

This application is a continuation, under 35 U.S.C. § 120, of copending international application No. PCT/EP2018/059590, filed Apr. 13, 2018, which designated the United States; this application also claims the priority, under 35 U.S.C. § 119, of German patent application No. DE 10 2017 217 232, filed Sep. 27, 2017; the prior applications are herewith incorporated by reference in their entireties.

BACKGROUND OF THE INVENTION

Field of the Invention

The invention relates to an electronic circuit breaker and a method for operating the same.

Current-limiting electronic circuit breakers typically have a metal oxide semiconductor field effect transistor (MOSFET) as a semiconductor switch, i.e. an element with variable electrical resistance, to maintain a current flowing through a load (load current) at a constant level in the event of a fault, such as a short circuit or overload.

In particular, the MOSFET is coupled with a comparatively fast-switching current limiting circuit in order to implement a constant current source. In particular, the current limiting circuit compares the load current, also referred to hereafter as the consumer current, in particular its current intensity, with a specified setpoint value and changes the gate voltage of the MOSFET accordingly to keep the current flow, in particular the consumer current, constant.

Typically, the current intensity of the consumer current is lower than the specified setpoint value. As a result, the gate voltage increases so that the MOSFET is saturated. In the event of a fault, the consumer current is limited by the current limiting circuit. For example, FIG. 1 shows a temporal profile of consumer current in accordance with the prior art, in which a short circuit occurs at time t=0. The consumer/load current is designated here by $I_d$. In this case, in particular due to the design of the current limiting circuit, a finite (reaction) time elapses between the onset of the fault, occurring in particular in the load, and the output of a switching signal or control signal. This delay is manifested as a current peak in the load current at the onset of the fault. In this case, in the event of a short-circuit the load current will have a current intensity of several hundred Amperes, for example, wherein the duration of the current peak depends, in particular, on the response time of the current limiting circuit. For example, the MOSFET can fail with a relatively slow response time of the current limiting circuit and as shown in FIG. 2, faults can additionally be induced in the voltage supply of the power source or the input voltage, which is indicated in FIG. 2 by "Input Voltage".

In particular, an improvement in the speed of response of the current limiting circuit is associated with the use of comparatively expensive components and reduces the stability of the control loop (the current limiting circuit). As a result, for example, under changing load conditions the signal output by the current limiting circuit, and hence the load current, exhibits oscillation which is particularly undesirable.

In order to be able to use current-limiting electronic circuit breakers under relatively variable load conditions, a current limiting circuit, in particular one with an adequate reaction time, and a MOSFET are typically used, which can cope with the current peaks sufficiently well. In particular, however, even with this arrangement an instability still occurs in the control loop. In addition, the design of the MOSFET can be over-dimensioned, which in turn adversely increases costs.

BRIEF SUMMARY OF THE INVENTION

The object of the invention is to specify a suitable electronic circuit breaker, by which a load is protected against an overload or a short circuit. In addition, a method will be specified for operating the same.

The object is achieved according to the invention by the features of the independent claim with respect to the electronic circuit breaker. With regard to the method, the object is achieved according to the invention by the features of independent method claim. Advantageous embodiments and extensions form the subject matter of the dependent claims. In these the comments in relation to the electronic circuit breaker also apply mutatis mutandis to the method, and vice versa.

To this end the circuit breaker contains a first semiconductor switch, which is switched in a current path between a voltage input and a load output, and a control device connected to the control input of the first semiconductor switch. Also, the first semiconductor switch is actuated as a function of an actual value of the load current which is fed to the control device. In addition, the control device is configured to limit the current of the first semiconductor switch and to switch off the same, in other words to switch the semiconductor switch into a non-conducting state (current-blocking).

Preferably, to detect the load current, in particular its current intensity, and to provide the actual value of the load current the electronic circuit breaker has a current sensor which is connected into the current path. The current sensor is advantageously connected in the current path, in series with the first semiconductor switch. Preferably, the current sensor supplies the actual value, which in particular represents the load current, to the control device as a voltage or a voltage value.

In other words, the control device has a device and/or a circuit for current limiting as well as a device and/or a circuit for shutting off or blocking the current flow of the first semiconductor switch. In other words, in particular by means of the current limiting device and/or circuit, the load current is restricted (limited), in particular actively, i.e. by means of a control process. In particular, in addition, by means of the device and/or circuit for shutting off and/or blocking the load current, the load current is disabled as necessary in the event of a fault, i.e. the electrical circuit is broken, so that a current is prevented from flowing by means of the disconnection and/or the current blocking.

The first semiconductor switch is thus actuated as a function of an actual value representing the load current, which actual value is determined and output by the current sensor, in particular. In this case, the actual value is fed to the control device, the current limiting device or circuit and/or the shut-off device or circuit. The current limiting device or circuit and/or the shut-off device or circuit is/are advantageously connected on the output side to the control input of the first semiconductor switch.

According to one advantageous design, the control device has a control unit. For example, the control unit is implemented as a common component with the current limiting device or circuit and the shut-off device or circuit. Alternatively, the current limiting device or circuit and the shut-off device or circuit each have a control unit. For example, the control unit is a microcontroller, preferably a microprocessor.

Preferably, the control device or control unit compares the actual value fed thereto with a specified, specifiable, adjusted and/or adjustable maximum value. According to an advantageous refinement, when the actual value exceeds the maximum value the control device or control unit outputs a signal, in particular a shut-off signal, to the shut-off device or circuit for switching off the first semiconductor switch, hereafter referred to as the "shut-off circuit" for short, and alternatively or preferably additionally to the current limiting device or circuit of the first semiconductor switch, hereafter referred to as the "current limiting circuit" for short. In particular, the maximum value here represents a threshold value, which when exceeded implies that a short circuit is present. In other words the maximum value represents a short-circuit current.

In an advantageous design the actual value is fed to the input side of the control device or the current limiting circuit. In addition, the current limiting circuit is supplied on the input side, in particular by the control unit, with a nominal setpoint value which is specified or specifiable to the control device, in particular to the control unit and/or adjusted and/or adjustable on the control device or on the control unit. The nominal target value represents, in particular, a magnitude of a current intensity to which the load current is limited when current limiting applies.

In a suitable refinement the first semiconductor switch is actuated in a current-limiting state, in particular by means of the current limiting circuit, as a function of the actual value and the nominal setpoint value. In particular, the first semiconductor switch is actuated in a current-limiting state when the nominal setpoint value is exceeded by the actual value, and provided the maximum value $I_{short}$ has not been exceeded.

To this end, the current limiting circuit has an adjustment element. In this case, the nominal target value is and/or can be fed to the adjustment element, in particular on the input side, in particular by the control device, preferably by the control unit. In addition, the adjustment element outputs a setpoint value on the output side. In other words, by means of the adjustment element a setpoint value derived from the nominal target value is output here. In particular, the first semiconductor switch is actuated in a current-limiting state as a function of this setpoint value and the actual value, in particular as a function of a difference between the setpoint value and the actual value.

In an advantageous design the adjustment element has a capacitor, wherein, for example, the voltage applied thereto is used as an output signal of the adjustment element. This capacitor is coupled via a switch in a first switch position to the control device, in particular, to supply the nominal setpoint value, or a voltage value representing the same. In a second switch position the capacitor is discharged, for which purpose the capacitor is placed, for example, at a reference potential such as ground, by means of the switch in the second switch position.

In summary, by means of the switch a voltage applied to the capacitor is or can be changed accordingly, which is used as the output signal of the adjustment element.

In addition, in an advantageous refinement the current limiting circuit has an operational amplifier. The adjustment element is connected to the first input thereof to supply the setpoint value, and the actual value is supplied to the second input, for example its inverting input. Alternatively, the nominal target value is fed to the second input, in particular if the current limiting device or circuit has no adjustment element. By means of the operational amplifier, in a suitable design a control signal Control-Signal is formed for actuating the semiconductor switch, in particular, a difference between the setpoint value and the actual value, which is used in particular for current limiting. For example, in addition a capacitor can be connected to the operational amplifier in a negative feedback path, forming an integrator (Integrator), wherein in that case, in particular, a control signal is formed from an integral of the difference over time.

Preferably, a voltage applied to the load (load voltage), or alternatively a load voltage signal representing the load voltage, is fed to the control device or control unit. For example, by means of the load voltage or load voltage signal and the actual value fed to the control device or control unit, a power supplied to the load can be determined.

Preferably, the control device, the current limiting circuit and/or the shut-off circuit have a second semiconductor switch. For example, the second semiconductor switch is designed as a common component with the current limiting circuit and the shut-off circuit. Preferably, this second semiconductor switch is implemented as a pnp-junction bipolar transistor.

In addition, the second semiconductor switch is preferably arranged on the output side of the control device, the current limiting circuit and/or the shut-off circuit and connected to the control input of the first semiconductor switch. For example, the second semiconductor switch is connected at the emitter terminal (output terminal) to the control input of the first semiconductor switch. In particular, the output of the second semiconductor switch thus forms an output of the current limiting circuit or the shut-off circuit. If the second semiconductor switch is implemented as a common component with the current limiting circuit and/or the shut-off circuit, the second semiconductor switch is preferably used to actuate the first semiconductor switch both in the switched-off or non-conducting state and in the current-limiting state.

In this case the base thereof, i.e., the input terminal of the second semiconductor switch, is preferably connected to other components of the current limiting device or circuit and to the shut-off device or circuit, wherein the current limiting device or circuit and the shut-off device or circuit are connected, for example, in parallel with the base.

The first semiconductor switch is preferably an N-channel MOS transistor (NMOS, NMOSFET). Preferably, the drain terminal of this is connected to the voltage input, the source terminal is connected to the load output, and the gate terminal, i.e. with the control input thereof, is connected to the control device. In particular, the first semiconductor switch is wired as a voltage-controlled current source, i.e. it is integrated into a corresponding voltage-controlled current source circuit, wherein the output current (load current) thereof is adjusted by means of the control device.

Provided a load is connected to the circuit breaker, the first terminal of the load is connected to the load terminal, and its second terminal is routed, for example, to a reference potential, such as ground (GND).

According to the invention, in a method for operating an electronic circuit breaker which is configured in accordance with one of the variants described above and therefore has a first semiconductor switch connected between the voltage input and the load output, an actual value of the load current or the load current itself is recorded as the actual value. In addition, in the event of a short-circuit or if a maximum value is exceeded by the actual value, the semiconductor switch is switched off or switched into the non-conducting state, in particular by means of the shut-off circuit (device or circuit for shutting off or current blocking). In the event of an overload or a setpoint value being exceeded by the actual value, the semiconductor switch is switched into the current-limiting state, in particular by means of the current limiting circuit (device or circuit for current limiting).

According to an advantageous refinement, in the event of a short-circuit the setpoint value of the load current is set to a minimum value, in particular zero. For example, to this end the capacitor of the adjustment element is discharged and then preferably continuously (gradually) increased up to the nominal setpoint value by charging the capacitor. For example, this is carried out using the adjustment element.

In an advantageous design of the method a difference value is formed from the actual value and the setpoint value. This difference value, in particular in the case of an overload, is used as a control signal to actuate the first semiconductor switch in a current-limiting state. The operational amplifier is advantageously used for this purpose.

Preferably, the first semiconductor switch, which is controlled in the current-limiting state, is switched to a non-conducting state or switched off and/or controlled accordingly, after the expiry of a specified period of time or a specified timer element. In other words, the first semiconductor switch is preferably switched and/or actuated in the non-conducting state when the current limiting has persisted, in particular without interruption, for the specified period of time or the timer element since the start of the current-limiting actuation.

In summary, the advantages of the invention are due, in particular, to the fact that by means of the control device, in particular by means of its shut-off circuit, the electronic circuit breaker is effective relatively quickly in the event of a short circuit. In this way, current peaks in the load current when a short circuit occurs are only comparatively small, i.e. they have a comparatively low maximum current intensity, so that any damage to a load and/or voltage or current source connected to the current path is avoided. In addition, due to the advantageously relatively low current peaks in the event of a short circuit, the use of oversized MOSFETs is not necessary, which results in cost savings.

Other features which are considered as characteristic for the invention are set forth in the appended claims.

Although the invention is illustrated and described herein as embodied in an electronic circuit breaker and a method for operating same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 3:
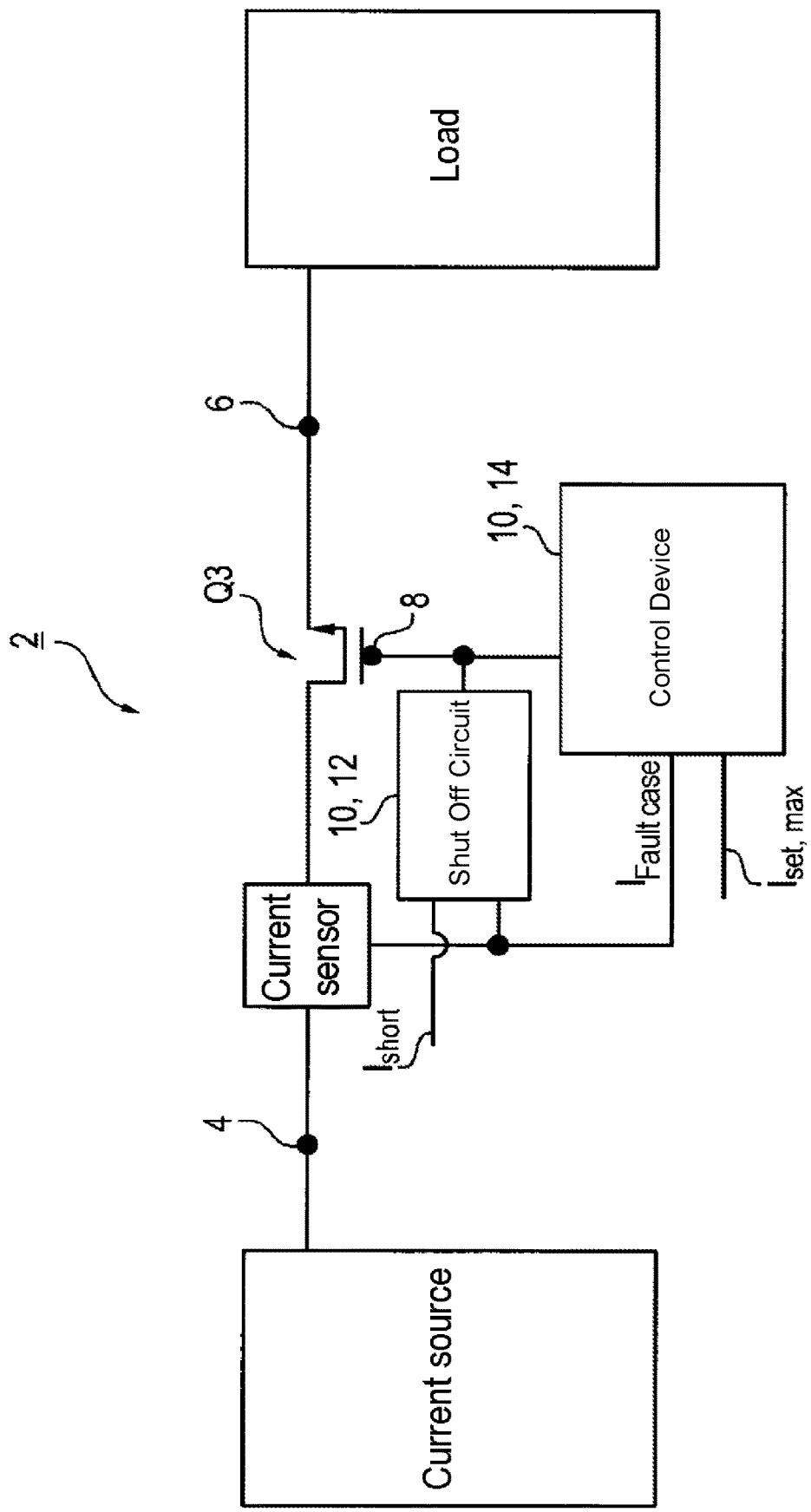
FIG. 3 is a block diagram of an electronic circuit breaker connected between a voltage input and a load output, a control input of which is connected to a control device, wherein a control device has a shut-off device and a current-limiting device.

Referring now to the figures of the drawings in detail and first, particularly to FIG. 3 thereof, there is shown an electronic circuit breaker 2 with a first semiconductor switch Q3 which is connected in a current path 3 between a voltage input 4 and a load output 6. A control input 8 of the first semiconductor switch Q3 is connected to a control device 10, wherein the control device 10 has a shut-off circuit 12, also referred to as a shut-off device 12, and a current limiting circuit 14, also referred to as a current limiting device 14. The shut-off circuit 12 in this case switches off the first semiconductor switch Q3, implemented as a MOSFET (Metal Oxide Semiconductor Field Effect Transistor, MOS transistor), in particular in the event of a short circuit or when required, wherein the shut-off takes place relatively quickly with respect to a response time of a conventional current limiting circuit.

In addition, for example, the current limiting circuit 14 is produced from comparatively inexpensive components and has a comparatively stable control behavior, in particular of the load current. As is apparent, in particular in FIGS. 6 and 8, due to the relatively rapid switching off of the first semiconductor switch Q3 only comparatively small current peaks occur. The control device 10 thus allows the use of MOSFETS which are only required to handle relatively small current peaks, thereby reducing costs and increasing reliability, for example with regard to the control stability.

Figure 6:
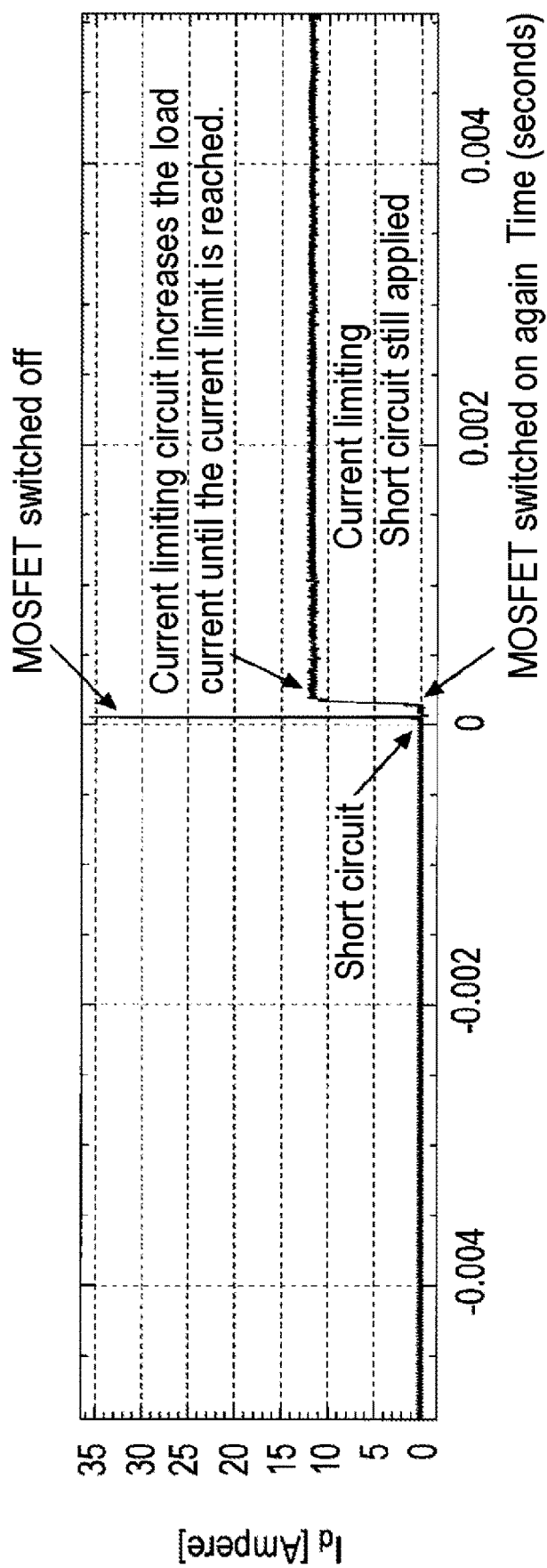
FIG. 6 is a current-time diagram of q temporal waveform of an output current (load current) in the current path in which the electronic circuit breaker configured according to the invention is connected, in a short-circuit condition, wherein by means of the electronic circuit breaker according to the invention the load current is first switched to a non-conducting state and then to a current-limiting state.

In this case, the first semiconductor switch Q3 is switched off (switched to the current-limiting state) as soon as its load current (output current) exceeds a maximum value $I_{short}$, in particular representing a short-circuit current. The first semiconductor switch Q3 is then actuated in a current-limiting state, wherein the current limiting circuit 14 limits the load current $I_{load}$, in particular its current intensity, in such a way that the load current $I_{load}$, in particular its current intensity, is increased gradually (continuously, rising relatively slowly) from a minimum value $I_{min}$, in particular zero, to a current intensity up to a nominal setpoint $I_{set,max}$ (FIG. 6). In FIG. 6 the load current $I_{load}$ is designated as $I_d$.

Figure 1:
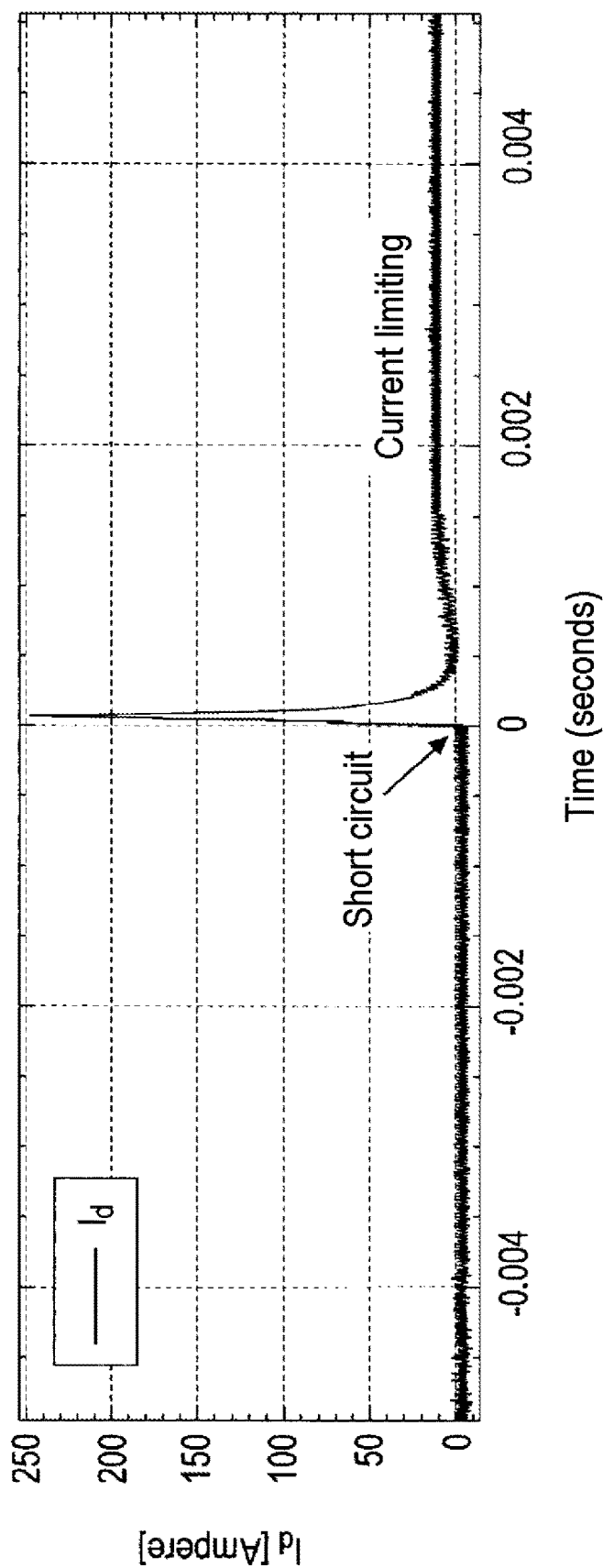
FIG. 1 is a current-time diagram showing a temporal waveform of an output current (load current) of an electronic circuit breaker in accordance with the prior art when a short circuit occurs.
Figure 2:
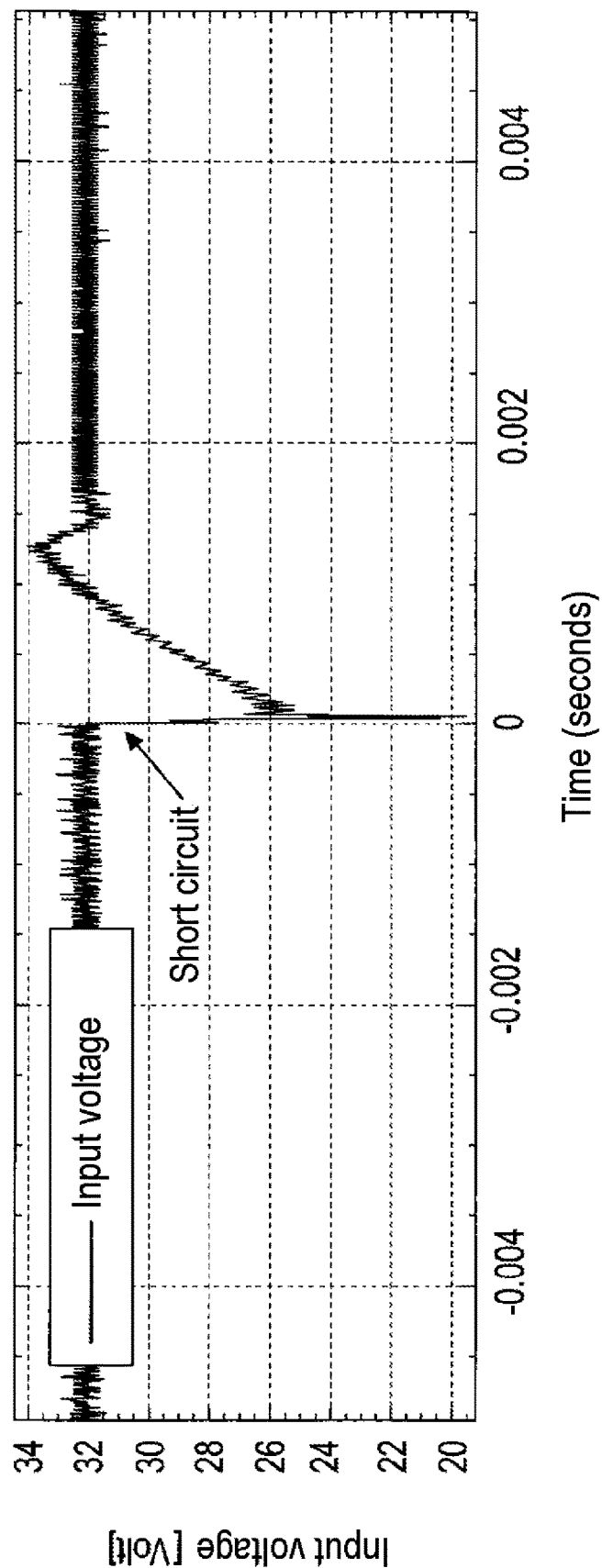
FIG. 2 is a voltage-time diagram corresponding to FIG. 1, showing a waveform of a supply voltage of a current source in the event of a short circuit in accordance with the prior art.
Figure 7:
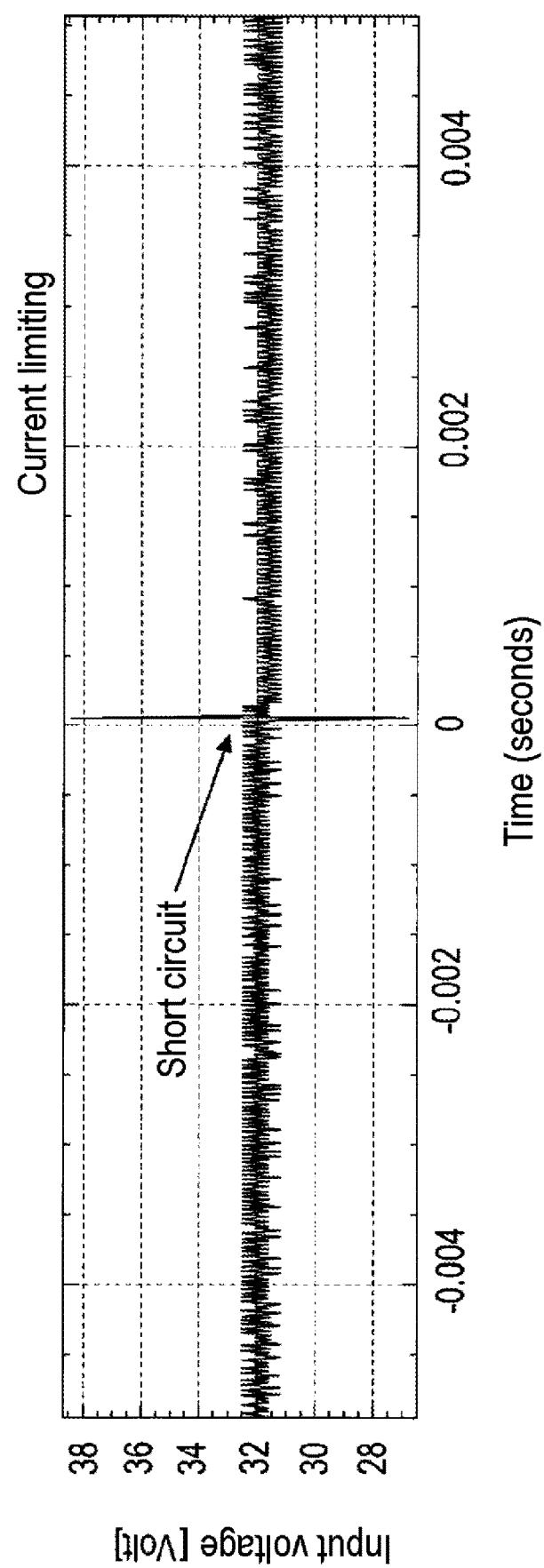
FIG. 7 is a voltage-time diagram corresponding to FIG. 6 showing the waveform of the supply voltage of the current source, wherein the electronic circuit breaker according to the invention is first switched to a non-conducting state and then to a current-limiting state.

As shown in FIGS. 6 and 7, abnormalities in the supply voltage and therefore, in particular, the input voltage, which is designated in FIG. 7 as Input Voltage, and the current peak when the electronic circuit breaker 2 according to the invention is used, are comparatively small in relation to abnormalities in the supply voltage and the current peak when an electronic circuit breaker in accordance with the prior art is used (FIGS. 1 and 2).

Figure 4:
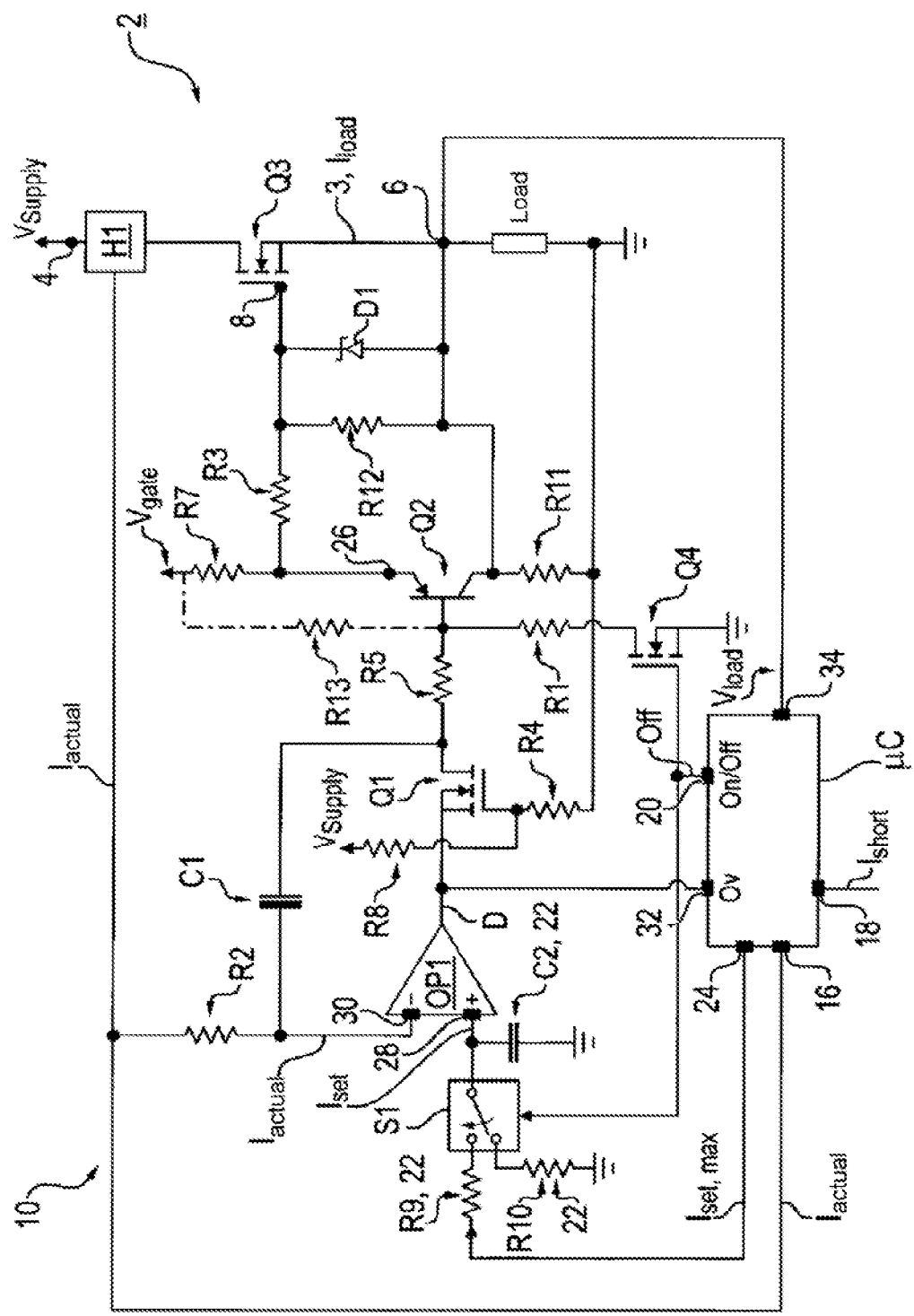
FIG. 4 is a block circuit diagram showing the electronic circuit breaker with a controllable semiconductor switch connected into a current path, and a control device provided and configured for controlling the same.

FIG. 4 shows a block circuit diagram of the electronic circuit breaker 2. The load current $I_{load}$ is recorded by a current sensor H1 connected in the current path 3 and output as an actual value $I_{actual}$ representing this load current $I_{load}$ to the control device 10, in particular to a first input (pin) 16 of a control unit μC of the control device 10. The actual value $I_{actual}$ is in the form of a voltage or a voltage signal. In this case, the current sensor H1 advantageously has a switching speed which is such that relatively rapid changes, for example in the event of a short circuit, are detected (resolved) by means of this recorded current. In the event of a short circuit, the actual value $I_{actual}$ exceeds the maximum value $I_{short}$, which in particular is fed to a second input (pin) 18 of the control unit μC, so that, for example, a disconnection is triggered in the control unit μC and so that the control unit μC, implemented as a microcontroller, outputs a signal Off, for example a voltage, at its first output 20 which preferably remains output (applied) until the signal Off at the output is switched off.

Alternatively, in a variant not shown in detail, the actual value $I_{actual}$ is fed to a first input of a second operational amplifier implemented as a comparator, and the maximum value $I_{short}$ is fed to the second input of the second operational amplifier. The output of the second operational amplifier is then connected to an input of the control unit μC. Thus, when the maximum value $I_{short}$ is exceeded by the actual value $I_{actual}$ a corresponding (control or voltage) signal is fed to this input of the control unit μC.

The first output 20 is connected via a fourth semiconductor switch Q4 to a second semiconductor switch Q2 and in parallel to a switch S1 of an adjustment element 22. The adjustment element 22 in this case has a capacitor C2, which in a first switch position of the switch S1 is connected via a resistor R9 to a second output 24 of the control unit μC outputting the nominal setpoint value $I_{set,max}$, and in a second switch position of the switch S2 via a resistor R10 to a reference potential.

In addition, a voltage input $V_{gate}$ is connected via the resistors R7 and R3 to the control input 8 (the gate) of the first semiconductor switch Q3. By means of a voltage applied to this voltage input $V_{gate}$ and the electrical resistors R7 and R3, the operating point of the first semiconductor switch Q3 is adjusted.

By means of a diode D1, which is connected in a current path which runs between the gate (control input 8) and the source of the first semiconductor switch Q3, the voltage between the gate and source of the first semiconductor switch Q3 is limited. By means of the resistor R12 connected in parallel to the diode D1 the gate of the first semiconductor switch Q3 is discharged when no voltage is present in the circuit.

As a result of the signal Off, the second semiconductor switch Q2 is switched to the conducting state, its output 26 is coupled to the control input 8 of the first semiconductor switch Q3 so that as a result, the control input 8, implemented as a gate, of the first semiconductor switch Q3 is discharged. The load current $I_{load}$ is disconnected by means of the first semiconductor switch Q3. This process is realized within a relatively short period, typically 1-10 μs (FIG. 6). In addition, in particular at the same time, the signal is output to a switch S1. This switch is therefore connected in such a way that the capacitor C2 is discharged via the resistor R10.

In summary, the first semiconductor switch Q3 is actuated by means of the second semiconductor switch Q2. The resistors R3, R5, R7, R11 and R12 here are used to adjust the magnitude of the voltage applied to the control input 8 of the first semiconductor switch Q3.

In accordance with an alternative design of the electronic circuit breaker 2, this additionally has a current path between the voltage input $V_{gate}$ and the control input (the base) of the second semiconductor switch Q2. A resistor R13 is connected into this current path. This current path is illustrated in FIG. 4 by a dash-dotted line. When the signal Off is output, the fourth semiconductor switch Q4 is switched in such a way, in particular into the conducting state, that the first semiconductor switch Q3 is switched to the off state. In particular, the fourth semiconductor switch Q4 is switched to the conducting state so that the voltage applied to the control input 8 of the first semiconductor switch Q3 is correspondingly reduced.

After a prescribed time period, which is preferably designed such that the capacitor C2 just completely (fully) discharges, i.e. it corresponds to a discharge time of the capacitor C2 via the resistor R10, the signal Off is switched off, so that the switch S1 is in the first switch position again and the capacitor C2 is consequently charged via the resistor R9.

The adjustment element 22 is connected to a first input 28 of an operational amplifier OP1 and outputs a setpoint value $I_{set}$, which is represented by means of the voltage applied to the capacitor C2, to this first input 28. The actual value $I_{actual}$ is fed to a, in particular inverting, second input 30 of the operational amplifier.

By means of the operational amplifier OP1 a difference between actual value $I_{actual}$ and setpoint value $I_{set}$ is thus formed. This difference is output from the operational amplifier OP1 as control signal D. By means of a third semiconductor switch Q1 and the resistors R4 and R8 an amplifier is formed for the (voltage) signal D output by the operational amplifier OP1. The amplitude (the magnitude) of the signal D is thereby modified or adjusted (amplified) to an amplitude suitable for operating the second semiconductor switch Q2 and thus for actuating the first semiconductor switch Q3.

Figure 8:
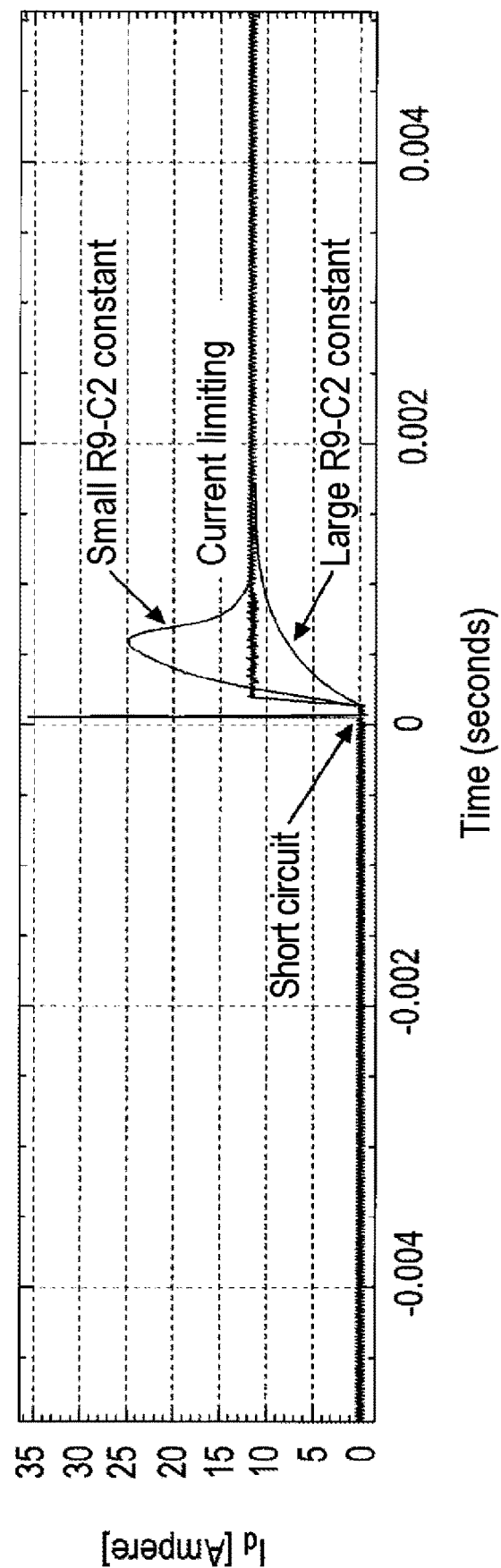
FIG. 8 is a current-time diagram showing temporal waveforms of an output current (load current) in the current path of an electronic circuit breaker configured according to the invention in the event of a short circuit for differently configured adjustment elements of the electrical circuit breaker, wherein following a shutdown of the electronic semiconductor switch the load current is controlled in a current-limiting state such that the load current is continuously increased.

As the capacitor C2 is charged via an electrical resistor R10 the setpoint value $I_{set}$ fed to the first input 28 changes according to the state of charge of the capacitor C2. This causes a corresponding, in particular gradual, change in the signal D. The second semiconductor switch Q2 is thus actuated in such a way, in particular to a gradually less conductive (non-conducting) state, that the first semiconductor switch Q3 is gradually (continuously) switched to the conducting state. In this way, the load current $I_{load}$ gradually increases until the actual value $I_{actual}$ fed to the first input 16 of the control unit pC corresponds to the nominal setpoint value $I_{set,max}$. As shown in FIG. 8, this allows the period of time in which load current $I_{load}$ increases to be determined (specified) by means of a suitable choice of the resistance value (size of the resistance) of the electrical resistor R9 and the capacitance of the capacitor C2, in other words by an appropriate design of the adjustment element 22. In this figure the load current is designated by $I_d$.

In addition, a capacitor C1 is connected in a current path between the second input 30 of the operational amplifier OP1 and its output. The capacitor C1 has a capacitance which is suitable for preventing an oscillation of the output signal of the operational amplifier OP1 and hence in the current path 3.

In accordance with FIG. 4, the shut-off circuit 12 contains in summary an electrical resistor R1 and the electrical resistor R10, the fourth semiconductor switch Q4, the switch S1, the control unit µC and, if applicable, the second operational amplifier. In particular, by forming a constant current source with a voltage applied to the current path 3 by means of the electrical resistors R2 to R5 and the electrical resistors R7 to R9, R11 and R12, by means of the capacitors C1 and C2, by means of the operational amplifier OP1, by means of the semiconductor switches Q1, Q2 and Q3, by means of the diode D1, and by means of the current sensor H1, the load current $I_{load}$ is advantageously regulated, in particular held constant.

In addition, the output signal of the operational amplifier OP1 in the form of control signal D, which is implemented in particular as an output voltage, is fed to a third input 32 of the control unit pC so that by means of this signal the control unit µC determines whether a current limitation of the load current $I_{load}$ by means of the first semiconductor switch Q3 is still taking place. To prevent thermal damage, in particular of the first semiconductor switch Q3, the first semiconductor switch Q3 is switched to the non-conducting state (switched off) if the current limiting has persisted for a specified duration since the beginning of the current-limiting actuation, in particular without interruption.

In addition a voltage $V_{load}$ applied to the load (Load) is fed to a fourth input 34 of the control unit µC.

Figure 5:
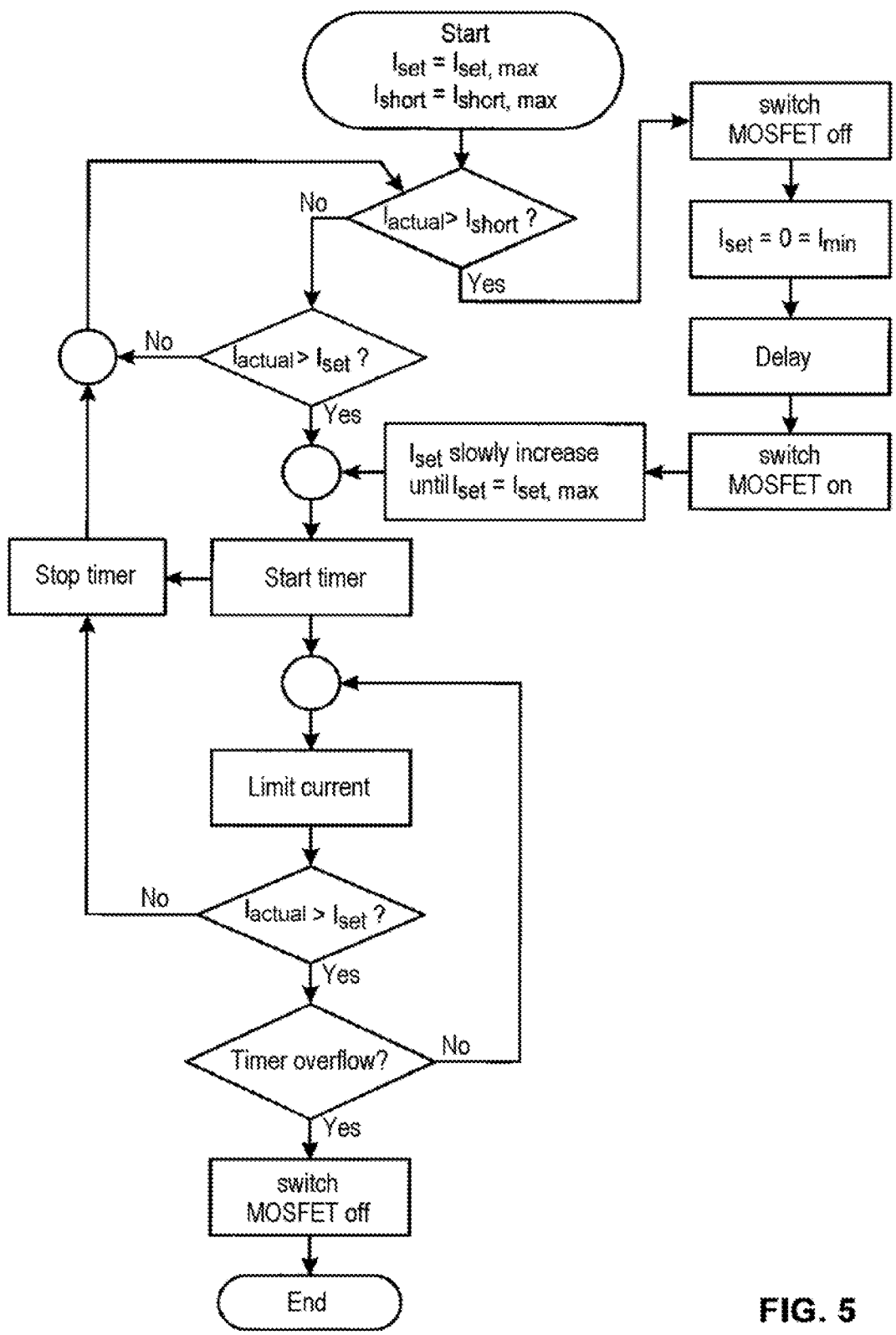
FIG. 5 is a flowchart of the processing sequence of the method for operating the electronic circuit breaker.

The processing sequence described above of the method for operating the electronic circuit breaker 2 is summarized in the flowchart of FIG. 5. It is also apparent that the first semiconductor switch Q3 is also actuated in the current-limiting state when the nominal setpoint value $I_{set,max}$ is exceeded by the actual value $I_{actual}$, but the maximum value $I_{short}$ is not exceeded.

In summary, the electronic circuit breaker 2 has a first semiconductor switch Q3, preferably an N-channel MOS transistor, which is connected in a current path 3 between a voltage input 4 and a load output 6. In addition, the electronic circuit breaker 2 has a control device 10 connected to the control input 8 of the first semiconductor switch Q3, wherein the first semiconductor switch Q3 is activated as a function of an actual value $I_{actual}$ of the load current $I_{load}$ which is fed to the control device 10. According to one advantageous refinement, the control device 10 has a control unit µC.

In an advantageous design, the electronic circuit breaker also has a current sensor H1, which is preferably connected in the current path 3.

In an advantageous design, the control device 10 has a device and/or a circuit 14 for current limiting, and a device and/or a circuit 12 for switching off or blocking the current of the first semiconductor switch Q3.

In a further advantageous design the first semiconductor switch Q3 is actuated as a function of an actual value $I_{actual}$ of the load current $I_{load}$ which is fed to the control device 10, the current-limiting device or circuit 14 and/or the shut-off device or circuit 12.

In accordance with a suitable design of the electronic circuit breaker, in the event of a short circuit and/or if a maximum value $I_{short}$ is exceeded by the actual value $I_{actual}$, the control device 10 or the control unit µC outputs a signal Off, in particular a shut-off signal, to the current-limiting device or circuit 14 and/or preferably to the shut-off device or circuit 12, to disable and/or switch off the first semiconductor switch Q3.

In a further advantageous design of the electronic circuit breaker the actual value $I_{actual}$ is fed to the input side of the control device 10 or the current-limiting device or circuit 14 and/or a nominal setpoint value $I_{set,max}$ is fed to the input side of the current-limiting device or circuit 14, in particular by the control unit µC.

In a further advantageous design, as a function of the actual value $I_{actual}$ and/or the nominal setpoint value $I_{set,max}$ the first semiconductor switch Q3 is or will be actuated in a current-limiting state.

In accordance with a suitable refinement, the control device 10 and/or the current-limiting device or circuit 14 has an adjustment element 22. The nominal setpoint value $I_{set,max}$ is fed in a suitable manner to the input side of the adjustment element 22 and it outputs a setpoint value $I_{set}$ at the output.

In a suitable design, the control device 10 or the adjustment element 22 has a capacitor C2. The capacitor C2 is advantageously coupled by means of a switch S1 to the control device 10, in particular to the control unit pC, or is discharged by means of the switch S1.

In another advantageous configuration, the control device 10 or the current-limiting 14 device or circuit 14 has an operational amplifier OP1. Advantageously the adjustment element 22 is connected to a first input 28 of the operational amplifier OP1 to feed in the setpoint value $I_{set}$, and the actual value $I_{actual}$ is fed to a second input of the operational amplifier OP1. By means of the operational amplifier OP1 a control signal D, in particular, a difference between the setpoint value $I_{set}$ and the actual value $I_{actual}$, is advantageously formed to actuate the first semiconductor switch Q3. In addition, in a suitable manner a load voltage $V_{load}$ is fed to the control device 10 or the control unit µC.

In an advantageous design, the control device 10, the current-limiting device or circuit 14 and/or the shut-off device or circuit 12 has a second semiconductor switch Q2, preferably a pnp bipolar transistor. In an advantageous design the second semiconductor switch Q2 is connected to the control input 8 of the first semiconductor switch Q3. In a further suitable design the output 26 of the second semiconductor switch Q2 preferably forms an output of the current-limiting device or circuit 14 and/or of the shut-off device or circuit 12.

In an appropriate design the drain of the first semiconductor switch Q3 is preferably connected to the voltage input 4, the source is preferably connected to the load output 6 and the gate to the control device 10.

In the method for operating the electronic circuit breaker 2, in one of the above-mentioned variants having a first semiconductor switch Q3 connected between a voltage input 4 and a load output 6, in accordance with the method an actual value $I_{actual}$ of the load current $I_{load}$ or said current is recorded as an actual value $I_{actual}$, in the event of a short circuit when a maximum value $I_{short}$ is exceeded by the actual value $I_{actual}$ the first semiconductor switch Q3 is switched to the non-conducting state, and/or in the event of an overload, on a setpoint $I_{set}$ being exceeded by the actual value $I_{actual}$ the first semiconductor switch Q3 is switched to a current-limiting state.

In an advantageous variant of the method, in the event of a short circuit the setpoint value $I_{set}$ of the load current $I_{load}$ is set to a minimum value $I_{min}$ and then increased continuously to a nominal setpoint value ($I_{set,max}$). Advantageously, a difference (difference value) is formed from the actual value $I_{actual}$ and the setpoint $I_{set}$. Advantageously the difference (difference value) is used as a control signal D for the current-limiting actuation of the first semiconductor switch Q3. The actuated first semiconductor switch Q3 actuated in the current-limiting state is appropriately switched into a non-conducting state and/or controlled after expiry of a specified period and/or a specified timer element.

The invention is not limited to the exemplary embodiment described above. Instead, other variants of the invention can also be derived from them by the person skilled in the art, without departing from the subject-matter of the invention. In particular, all individual features described in connection with the exemplary embodiments can also be combined together in different ways without departing from the subject matter of the invention.

LIST OF REFERENCE SIGNS 2 electronic circuit breaker
3 current path
4 voltage input
6 load output
8 control input
10 control device
12 shut-off device
14 current limiting device
16 first input to the control unit
18 second input to the control unit
20 first output of the control unit
22 adjustment element
24 second output of the control unit
26 output of the second semiconductor switch
28 first input of the operational amplifier
30 second input of the operational amplifier
32 third input to the control unit
34 fourth input to the control unit
C1 capacitor
C2 capacitor
D control signal/difference
D1 diode
H1 current sensor
$I_{actual}$ actual value
$I_{load}$ load current
$I_{min}$ minimum value
$I_{set}$ setpoint value
$I_{set,max}$ nominal setpoint value
$I_{short}$ maximum value
μC control unit
Off shut-off signal
OP1 operational amplifier
Q1 third semiconductor switch
Q2 second semiconductor switch
Q3 first semiconductor switch
Q4 fourth semiconductor switch
R1 to R13 electrical resistors
$V_{load}$ load voltage
$V_{gate}$ voltage input

The invention claimed is:

1. An electronic circuit breaker, comprising:
a first semiconductor switch being switched in a current path between a voltage input and a load output, said first semiconductor switch having a control input; and
a controller connected to said control input of said first semiconductor switch, wherein said first semiconductor switch being actuated in dependence on an actual value of a load current which is fed to said controller, wherein said controller is configured to limit a current of said first semiconductor switch and to switch off said first semiconductor switch, wherein said controller having a processor, a current limiting circuit and a shut-off circuit, on exceeding a maximum value by the actual value, said controller or said processor generating a signal sent to said current limiting circuit and/or to said shut-off circuit for switching off said first semiconductor switch;
wherein said current limiting circuit having an input side supplied with the actual value and with a nominal setpoint value, said current limiting circuit having an adjustment element, to which the nominal setpoint value being fed on an input side and said adjustment element outputting a setpoint value on an output side; and
said controller having a switch and said adjustment element having a capacitor, which is coupled with said processor by means of said switch or is discharged by means of said switch.

2. The electronic circuit breaker according to claim 1, wherein said first semiconductor switch is actuated in a current-limiting state in dependence on the actual value and on the nominal setpoint value.

3. The electronic circuit breaker according to claim 1, wherein said current limiting circuit has an operational amplifier with a first input connected to said adjustment element for feeding in the setpoint value, and a second input which is fed the actual value.

4. The electronic circuit breaker according to claim 3, wherein said operational amplifier outputs a control signal for actuating said first semiconductor switch.

5. The electronic circuit breaker according to claim 1, wherein said controller, said current limiting circuit and/or said shut-off circuit has a second semiconductor switch, which is connected to said control input of said first semiconductor switch.

6. The electronic circuit breaker according to claim 1, wherein the signal is a switch-off signal.

7. The electronic circuit breaker according to claim 1, wherein said controller supplies the actual value and the nominal setpoint value.

8. The electronic circuit breaker according to claim 4, wherein the control signal represents a difference between the setpoint value and the actual value.

9. A method for operating an electronic circuit breaker having a first semiconductor switch switched between a voltage input and a load output, the method comprises the steps of:
recording an actual value of a load current or the load current is recorded as the actual value;
switching the first semiconductor switch to a non-conducting state in an event of a short-circuit due to a maximum value being exceeded by the actual value, wherein in the event of the short-circuit the setpoint value of the load current being set to a minimum value and then increased continuously to a nominal setpoint value; and
switching the first semiconductor switch to a current-limiting state in an event of an overload due to a setpoint value being exceeded by the actual value.

10. The method according to claim 9, which further comprises:
   forming a difference between the actual value and the setpoint value; and
   using the difference as a control signal for actuating the first semiconductor switch in the current-limiting state.

11. The method according to claim 9, wherein the first semiconductor switch actuated in the current-limiting state is switched or actuated into a non-conducting state after expiry of a specified period of time or a specified timer element.

* * * * *